(12) United States Patent
Chuang et al.

(10) Patent No.: US 8,345,504 B2
(45) Date of Patent: Jan. 1, 2013

(54) DATA-AWARE DYNAMIC SUPPLY RANDOM ACCESS MEMORY

(75) Inventors: Ching-Te Chuang, Taipei County (TW); Hao-I Yang, Taipei (TW); Yi-Wei Lin, Taipei County (TW); Wei Hwang, Taipei (TW); Wei-Chiang Shih, Taipei (TW); Chia-Cheng Chen, Taichung County (TW)

(73) Assignees: Faraday Technology Corp., Science-Based Industrial Park, Hsin-Chu (TW); National Chiao Tung University, Hsinchu (TW)

( * ) Notice: Subject to any disclaimer, the term of this patent is extended or adjusted under 35 U.S.C. 154(b) by 189 days.

(21) Appl. No.: 13/009,240

(22) Filed: Jan. 19, 2011

(65) Prior Publication Data

US 2012/0044779 A1 Feb. 23, 2012

(30) Foreign Application Priority Data

Aug. 19, 2010 (TW) ................................ 99127792 A

(51) Int. Cl.
*G11C 11/40* (2006.01)
(52) U.S. Cl. .......................... 365/226; 365/154; 365/190
(58) Field of Classification Search ........................ None
See application file for complete search history.

(56) References Cited

U.S. PATENT DOCUMENTS

| | | | | |
|---|---|---|---|---|
| 4,896,299 A | * | 1/1990 | Wada et al. | 365/189.04 |
| 4,928,266 A | * | 5/1990 | Abbott et al. | 365/189.14 |
| 5,708,599 A | * | 1/1998 | Sato et al. | 365/154 |
| 5,991,191 A | * | 11/1999 | Rao | 365/154 |
| 7,570,537 B2 | | 8/2009 | Bhatia | |
| 8,018,788 B2 | * | 9/2011 | Jung et al. | 365/226 |

OTHER PUBLICATIONS

S. Mukhopadhyay, R. Rao, J. J. Kim, C. T. Chuang, Capacitive Coupling Based Transient Negative Bit-line Voltage (Tran-NBL) Scheme for Improving Write-ability of SRAM Design in Nanometer Technologies, 2008 IEEE, pp. 384-387.
D.P. Wang, H.J. Liao, H. Yamauchi, Y.H. Chen, Y.L. Lin, S.H. Lin, D. C. Liu, H.C. Chang, and W. Hwang; A 45nm Dual-Port SRAM with Write and Read Capability Enhancement at Low Voltage; 2007 IEEE, pp. 211-214.
K. Nii, M. Yabuuchi, Y. Tsukamoto, S. Ohbayashi, Y. Oda, K. Usui, T. Kawamura, N. Tsuboi, T. Iwasaki, K. Hashimoto, H. Makino and H. Shinohara, A 45-nm Single-port and Dual-port SRAM family with Robust Read/Write Stabilizing Circuitry under DVFS Environment, 2008 IEEE, Symposium on VLSI Circuits Digest of Technical Papers, pp. 212-213.
M. Yabuuchi, K. Nii, Y. Tsukamoto, S. Ohbayashi, Y. Nakase and H. Shinohara, "A 45nm 0.6V Cross-Point 8T SRAM with Negative Biased Read/Write Assist", Renesas Technology Corp., 4-1, Mizuhara, Itami, Hyogo, Japan. 2009 Symposium on VLSI Circuits Digest of Technical Papers, pp. 158-159.

(Continued)

*Primary Examiner* — Tan T. Nguyen
(74) *Attorney, Agent, or Firm* — Winston Hsu; Scott Margo

(57) ABSTRACT

A Random Access Memory (RAM) with a plurality of cells is provided. In an embodiment, the cells of a same column are coupled to a same pair of bit-lines and are associated to a same power controller. Each cell has two inverters; the power controller has two power-switches. For the cells of the same column, the two power-switches respectively perform independent supply voltage controls for the two inverters in each cell according to data-in voltages of the bit-lines during Write operation.

10 Claims, 16 Drawing Sheets

OTHER PUBLICATIONS

K. Zhang, U. Bhattacharya, Z. Chen, F. Hamzaoglu, D. Murray, N. Vallepalli, Y. Wang, B. Zheng, M. Bohr, "A 3-GHz 70Mb SRAM in 65nm CMOS Technology with Integrated Column-Based Dynamic Power Supply", Intel, Hillsboro, OR, 2005 IEEE International Solid-State Circuits Conference.

Masanao Yamaoka1, Noriaki Maeda2, Yoshihiro Shinozaki3, Yasuhisa, Shimazaki2, Koji Nii2, Shigeru Shimada2, Kazumasa Yanagisawa2, Takayuki Kawahara1, "Low-Power Embedded SRAM Modules with Expanded Margins for Writing", 1Hitachi, Tokyo, Japan, 2Renesas Technology, Tokyo, Japan, 3Hitachi ULSI Systems, Fukuoka, Japan, 2005 IEEE International Solid-State Circuits Conference.

Hiroyuki Yamauchi, Member, Toshikazu Suzuki, and Yoshinobu Yamagami, Nonmembers, "A Differential Cell Terminal Biasing Scheme Enabling a Stable Write Operation against a Large Random Threshold Voltage (Vth) Variation", IEICE Trans. Electron., vol. E89-C, No. 11 Nov. 2006.

Toshikazu Suzuki, Hiroyuki Yamauchi, Yoshinobu Yamagami, Katsuji Satomi, and Hironori Akamatsu, "A Stable SRAM Cell Design Against Simultaneously R/W Disturbed Accesses", Corporate SLSI Development Div., Semiconductor Company, Matsushita Electric Industrial Co., Ltd. Faculty of Information Engineering, Dept. of Computer Science and Engineering, Fukuoka Institute of Technology, Kyoto, Fukuoka, Japan, 2006 Symposium on VLSI Circuits Digest of Technical Papers.

Meng-Fan Chang1, Jui-Jen Wu1, Kuang-Ting Chen1, and Hiroyuki Yamauchi2, "A Differential Data Aware Power-supplied (D2AP) 8T SRAM Cell with Expanded Write/Read Stabilities for Lower VDDmin Applications", 1EE Dept., National Tsing Hua University, Taiwan, 2Fukuoka Institute of Technology, Japan, 2009 Symposium on VLSI Circuits Digest of Technical Papers.

* cited by examiner

|  | standby | read | write "1" | write "0" |
|---|---|---|---|---|
| WEB | 1 | 1 | 0 | 0 |
| BL(n) | 1 | x | 1 | 0 |
| BLB(n) | 1 | x | 0 | 1 |
| WL(m) | 0 | 1 | 1 | 1 |
| WL(m') | 0 | 0 | 0 | 0 |
| VVDD1 | VDD | VDD | VDD | <VDD |
| VVDD2 | VDD | VDD | <VDD | VDD |
| M1 | on | on | on | off |
| M2 | on | on | off | on |

FIG. 2

|       | standby | read "1" | read "0" | write "1" | write "0" |
|-------|---------|----------|----------|-----------|-----------|
| BL(n) | 1       | x        | x        | 1         | 0         |
| BLB(n)| 1       | x        | x        | 0         | 1         |
| WL(m) | 0       | 1        | 1        | 1         | 1         |
| VVDD1 | VDD     | VDD      | <VDD     | VDD       | <VDD      |
| VVDD2 | VDD     | <VDD     | VDD      | <VDD      | VDD       |

FIG. 4

|       | standby | read | write "1" | write "0" |
|-------|---------|------|-----------|-----------|
| WEB   | 1       | 1    | 0         | 0         |
| BL(n) | 1       | x    | 1         | 0         |
| BLB(n)| 1       | x    | 0         | 1         |
| WL(m) | 0       | 1    | 1         | 1         |
| VVDD1 | VDD     | VDD  | VDD       | <VDD      |
| VVDD2 | VDD     | VDD  | <VDD      | VDD       |

FIG. 6

|        | standby | read "1" | read "0" | write "1" | write "0" |
|--------|---------|----------|----------|-----------|-----------|
| BL(n)  | 1       | x        | x        | 1         | 0         |
| BLB(n) | 1       | x        | x        | 0         | 1         |
| WL(m)  | 0       | 1        | 1        | 1         | 1         |
| VVDD1  | VDD     | VDD      | <VDD     | VDD       | <VDD      |
| VVDD2  | VDD     | <VDD     | VDD      | <VDD      | VDD       |

FIG. 8

|  | standby | read | write "1" | write "0" |
|---|---|---|---|---|
| WE | 0 | 0 | 1 | 1 |
| WEB | 1 | 1 | 0 | 0 |
| BL(n) | 1 | x | 1 | 0 |
| BLB(n) | 1 | x | 0 | 1 |
| WL(m) | 0 | 1 | 1 | 1 |
| VVDD1 | VDD | VDD | VDD | <VDD |
| VVDD2 | VDD | VDD | <VDD | VDD |
| VVSS1 | VSS | VSS | >VSS | VSS |
| VVSS2 | VSS | VSS | VSS | >VSS |

FIG. 10

|  | standby | read | write "1" | write "0" |
|---|---|---|---|---|
| WEB | 1 | 1 | 0 | 0 |
| BL(n) | 1 | x | 1 | 0 |
| WL(m) | 0 | 1 | 1 | 1 |
| VVDD2 | VDD | VDD | <VDD | VDD |
| VVSS1 | VSS | VSS | >VSS | VSS |

FIG. 12

|  | standby | read | write "1" | write "0" |
|---|---|---|---|---|
| WEB | 1 | 1 | 0 | 0 |
| BL(n) | 1 | x | 1 | 0 |
| WL(m) | 0 | 1 | 1 | 1 |
| VVDD1 | VDD | VDD | VDD | <VDD |
| VVDD2 | VDD | VDD | <VDD | VDD |
| VVSS1 | VSS | VSS | >VSS | VSS |

FIG. 14

|         | standby | read | write "1" | write "0" |
|---------|---------|------|-----------|-----------|
| BL1(n)  | 1       | x    | 1         | 0         |
| BLB1(n) | 1       | x    | 0         | 1         |
| WL1(m)  | 0       | 1    | 1         | 1         |
| BL2(n)  | 1       | x    | 1         | 0         |
| BLB2(n) | 1       | x    | 0         | 1         |
| WL2(m)  | 0       | 1    | 1         | 1         |
| VVDD1   | VDD     | VDD  | VDD       | <VDD      |
| VVDD2   | VDD     | VDD  | <VDD      | VDD       |

FIG. 16

DATA-AWARE DYNAMIC SUPPLY RANDOM ACCESS MEMORY

This application claims the benefit of Taiwan application Serial No. 099127792, filed Aug. 19, 2010, the subject matter of which is incorporated herein by reference.

FIELD OF THE INVENTION

The present invention relates to a Random Access Memory (RAM), and more particularly, to a RAM with column-based independent supply controls for two respective inverters in each of Static RAM (SRAM) cells of a column to resolve the conflicting requirements of Read and Write operations

BACKGROUND OF THE INVENTION

Random access memories, such as static RAM, have become one of the most important construction blocks of modern electronic systems. Modern RAM development demands small cell layout area and low operation voltage for improvement of density and power dissipation.

SUMMARY OF THE INVENTION

A RAM has a plurality cells arranged in an array of multiple columns and rows, each cell stores a bit of data for access. For example, a basic 6-Transistor (6T) static cell includes two inverters and two pass-gate transistors, each inverter is formed by a pair of complementary Metal-Oxide-Semiconductor (MOS) transistors. Each of the two inverters has an output terminal coupled to an input terminal of the other inverter to form a latch structure for latching data; and the output terminals of the two inverters, as a pair of data storage nodes, respectively store a bit of data and its complementary signal. In each cells of a column, each of the data nodes is coupled to one of a pair of Bit-Lines (BL's) through a pass-gate transistor. In each cells of a row, the pass-gate transistors have gates coupled to a Word-Line (WL), so each pass-gate transistor controls conduction between corresponding data storage node and bit-line according to a voltage of the word-line. In addition, there are cells with 5-Transistor (5T) and 8-Transistor (8T). A 5T cell has a single pass-gate transistor, and each cell of a column is accessed through a single bit-line. 8T cells are utilized to implement dual-port RAM where each cell is accessed by two pairs of bit-lines. An 8T dual-port cell includes two pairs of pass-gate transistors, each pair of pass-gate transistors respectively controls conduction between two data storage nodes of a cell and a pair of bit-lines according to the voltage of a same word-line.

Cell access operation of RAM is described as follows. While Reading data of a data storage node in a cell, a bit-line corresponding to the data node is first pre-charged to high voltage of logic 1. When Reading starts, the data storage node of the cell is connected to the bit-line by a corresponding pass-gate transistor; if the data storage node stores logic 0 of low voltage, the inverter in the cell pulls down the voltage of the bit-line to reflect stored data of logic 0. Before Reading starts, an n-channel MOS transistor in the inverter pulls down and hold the data storage node to low voltage so the data storage node can store logic 0. As Reading starts, however, voltage at the data storage node will be raised because the data storage node is connected to the bit-line which is at high voltage. Equivalently, the pass-gate transistor and the n-channel MOS transistor in the inverter form a voltage divider between high bit-line voltage of logic 1 and low voltage of logic 0 as Reading starts. If voltage at the data storage node is raised too high, it will exceed a trip voltage of the opposite inverter in the latch structure, and data of the data storage node will be incorrectly flipped from logic 0 to logic 1 by feedback mechanism of the latch structure. To prevent incorrect data flip during Read, weak pass-gate transistors (with narrower width or longer channels, lower conduction and larger source-drain resistance) are adopted in cells; whereas relatively strong (lower source-drain resistance) n-channel MOS transistors are used, such that the voltage at the data storage node will be contained to below the trip voltage of the opposite inverter to improve noise margin during Read.

Weaker pass-gate transistors are preferred for Read operation, but negative impacts are introduced for data Write. For example, when low voltage logic 0 is written into a data storage node of a cell through a bit-line, the data storage node is connected to the bit-line by a corresponding pass-gate transistor so the voltage at the data storage node can be pulled down to low voltage of logic 0. Assuming the data storage node originally stores logic 1 as it is connected to high voltage by a corresponding p-channel MOS transistor in a corresponding inverter; when logic 0 is written to the data storage node, the turned-on pass-gate transistor and the p-channel MOS transistor form a voltage divider. If the pass-gate transistor is weak, the voltage at the data storage node would become closer to high voltage of logic 1, and is harder to be pulled down to low voltage of logic 0. Equivalently, while Writing logic 0 to a data storage node storing logic 1, the pass-gate transistor competes against the p-channel MOS transistor which holds the data storage node to high voltage. If weak pass-gate transistors are adopted to improve the Read noise margin, their weak strength would be disadvantageous for Write. On the other hand, when high voltage logic 1 is written into a data storage node of a cell through a single bit-line (like in a 5T cell), the data storage node is connected to the bit-line by a corresponding pass-gate transistor so a voltage at the data storage node can be driven to high voltage of logic 1. Assuming the data node originally stores logic 0 as it is connected to low voltage by a corresponding n-channel MOS transistor in a corresponding inverter; when logic 1 is written to the data storage node, the turned-on pass gate transistor and the n-channel MOS transistor form a voltage divider. If the pass-gate transistor is weak, the voltage at the data storage node would become closer to low voltage of logic 0, and is harder to be driven to high voltage of logic 1. That is, in a cell with single bit-line, while Writing logic 1 to a data storage node storing logic 0, the pass-gate transistor competes against the n-channel MOS transistor which holds the data storage node to low voltage. Again, if weak pass-gate transistors are adopted to improve Read noise margin, their weak strength would be disadvantageous for Write.

In other words, requirements for data Read and data Write are mutually conflicting; and the conflict is more severe for compact layout/low operation voltage RAM/cell in advanced/scaled process. To mitigate the conflict of Read and Write operation, a RAM, with column-based independent supply controls for the two respective inverters in each cell of a column according to data voltages of bit-lines, is disclosed. In the disclosure of the invention, weak pass-gate transistors can be adopted to reduce Read disturb and improve Read Static Noise Margin (RSNM). To improve Write-ability and Write performance, when logic 0 is written to a data storage node originally storing logic 1, assuming the data storage node is held at high voltage (logic 1) by a p-channel MOS transistor of a first inverter, then, during Write operation, the power supply control of invention will reduce the source supply voltage of the p-channel MOS transistor of the first inverter, but maintain the source supply voltage of the p-channel MOS transistor of the opposite (second) inverter in the cell. Reducing source supply voltage of the p-channel MOS transistor of the first inverter lowers the Source-to-Gate voltage of the p-channel MOS transistor, thus reducing the conduction of the p-channel MOS transistor, so the pass-gate transistor between the data storage node and the bit-line can pull-down the data storage node to logic 0 much easier. Meanwhile, as source supply voltage for the p-channel MOS transistor of the opposite (second) inverter is maintained, the conduction of the p-channel MOS transistor of the opposite (second) inverter remains unchanged, thus the p-channel MOS transistor of the second inverter can rapidly pull-up the opposite data storage node to high voltage of logic 1. As aforementioned concept is implemented, bit-line voltages, i.e., data to be written, are used to determine whether source supply voltage reduction is applied to the p-channel MOS transistor of the first inverter or that of the second inverter.

Symmetrically, following aforementioned discussion, voltage supply to source of the n-channel MOS transistor of the first inverter can be raised to reduce voltage difference between its Gate and Source, so conduction of the n-channel MOS transistor is decreased to improve writing of logic 1 to the data storage node originally storing logic 0; meanwhile, source voltage supply of the n-channel MOS transistor of the opposite (second) inverter is maintained, so its conduction remains unchanged to rapidly pull-down the opposite data storage node to low voltage of logic 0.

Therefore, an object of the invention is to provide a RAM including a plurality of cells arranged in a column and a corresponding power controller. Each cell has a first power node, a second power node and a bit node, and the cells of the column have their bit nodes coupled to a same bit-line. Each cell includes a first inverter, a second inverter and a pass-gate transistor. The first inverter has a supply source terminal, an input terminal and an output terminal respectively coupled to the first power node, a second data storage node and a first data storage node. The second inverter also has a supply source terminal, an input terminal and an output terminal respectively coupled to the second power node, the first data storage node and the second data storage node. The pass-gate transistor has a terminal coupled to the bit node and another terminal coupled to one of the first data storage node and the second data storage node. The power controller has a supply node coupled to the first power nodes of the cells of the column, and includes a power-switch coupled to the bit-line and the supply node determining whether the supply node is connected to an operation voltage according to a voltage of the bit-line.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1 and FIG. 2 respectively illustrate a RAM and its operation according to an embodiment of the invention;

FIG. 3 and FIG. 4 respectively illustrate a RAM and its operation according to an embodiment of the invention;

FIG. 5 and FIG. 6 respectively illustrate a RAM and its operation according to an embodiment of the invention;

FIG. 7 and FIG. 8 respectively illustrate a RAM and its operation according to an embodiment of the invention;

FIG. 9 and FIG. 10 respectively illustrate a RAM and its operation according to an embodiment of the invention;

FIG. 11 and FIG. 12 respectively illustrate a RAM and its operation according to an embodiment of the invention;

FIG. 13 and FIG. 14 respectively illustrate a RAM and its operation according to an embodiment of the invention; and FIG. 15 and FIG. 16 respectively illustrate a RAM and its operation according to an embodiment of the invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
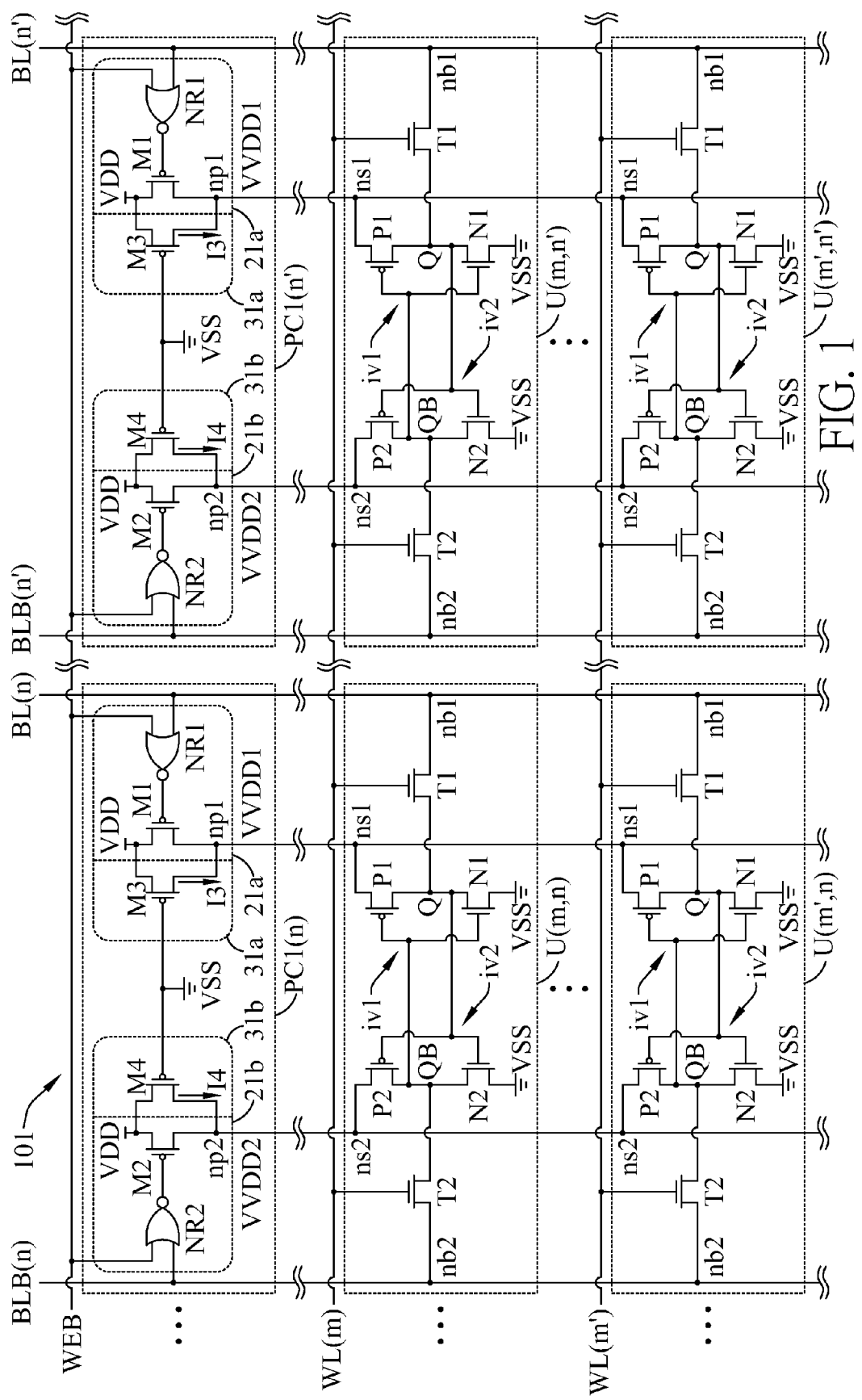

Please refer to FIG. 1 which illustrates a RAM 101 according to an embodiment of the invention. The RAM 101 can be a static RAM which includes a plurality of cells, such as cells U(m,n)・U(m,n')・U(m',n) and U(m',n') in FIG. 1; each cell is a 6T static RAM cell. These cells are arranged in an array of rows and columns; for example, the cells U(m,n) and U(m,n') are arranged in a same row and correspond to a same word-line WL(m); the cells U(m',n) and U(m',n') are arranged in another row and correspond to another word-line WL(m'). The cells U(m,n) and U(m',n) are arranged in a same column and correspond to a pair of bit-lines BL(n) and BLB(n); the cells U(m,n') and U(m',n') belong to another column and correspond to another pair of bit-lines BL(n') and BLB(n').

In RAM 101, each cells U(m,n) to U(m',n') are of a same architecture; as an example, the cell U(m,n) includes two matched transistors (e.g., n-channel MOS transistors) N1 and N2, two matched transistors (e.g., p-channel MOS transistors) P1 and P2, and two matched transistors (e.g., n-channel MOS transistors) T1 and T2. The transistors P1 and N1 form an inverter iv1 with an input terminal coupled to a node QB, an output terminal coupled to a node Q, a source of the transistor P1 coupled to a node ns1 and a source of the transistor N1 coupled to an operation voltage VSS (e.g., a ground). Symmetrically, The transistors P2 and N2 form an inverter iv2 with an input terminal coupled to the node Q, an output terminal coupled to the node QB, a source of the transistor P2 coupled to a node ns2 and a source of the transistor N2 coupled to the operation voltage VSS. The transistors T1 and T2 function as pass-gate transistors with their gates controlled by the word line-WL(m); the transistor T1 is coupled between a node nb1 and the node Q, and the transistor T2 is coupled between a node nb2 and the node QB. The nodes ns1 and ns2 act as two power nodes of the cell U(m,n), the nodes Q and QB are two data storage nodes, and the nodes nb1 and nb2 are two bit nodes respectively coupled to the bit-lines BL(n) and BLB(n).

For implementation of the invention, the RAM 101 further includes a plurality of power controllers, each power controller corresponds to cells of a column; In FIG. 1, the power controller PC1(n) corresponds to the column of the cells U(m,n) and U(m',n), and the power controller PC1(n') corresponds to another column of the cells U(m,n') and U(m',n'). Each of power controllers PC1(n) and PC1(n') has the same architecture, so following discussion continues with the power controller PC1(n) as an example.

In the embodiment of FIG. 1, the power controller PC1(n) includes two power-switches 21a and 21b, and two power-keepers 31a and 31b. Nodes np1 and np2 are two supply nodes of the power controller PC1(n), the node np1 is coupled the nodes ns1 of the cells U(m,n) and U(m',n) for providing a voltage VVDD1 to the inverters iv1 of the cells, and the node np2 is coupled the nodes ns2 of the cells U(m,n) and U(m',n) for providing a voltage VVDD2 to the inverters iv2 of the cells. The power switches 21a and 21b respectively include matched transistors (e.g., p-channel MOS transistors) M1 and M2, and matched NOR gates NR1 and NR2. The transistor M1 has a source coupled to an operation voltage VDD and a drain coupled to the node np1, the NOR gate NR1 is coupled between the bit-line BL(n) and the transistor M1; it performs logic NOR operation based on the voltage level of the bit-line BL(n) and a Write control signal WEB (Write Enable Bar), and has an output terminal coupled to a gate of the transistor M1, such that the transistor M1 determines whether to connect the supply node np1 to the operation voltage VDD according to a result of the logic operation. Symmetrically, the NOR gate NR2 performs NOR logic operation based on the voltage level of the bit-line BLB(n) and the Write control signal WEB, such that the transistor M2 determines whether to connect the supply node np2 to the operation voltage VDD according to result of logic operation by the NOR gate NR2. The power keepers—31a and 31b respectively include matched transistors (e.g., p-channel MOS transistors) M3 and M4 with their gates coupled to the operation voltage VSS, sources coupled to the operation voltage VDD and drains respectively coupled to the supply nodes np1 and np2. In a preferred embodiment of the invention, the transistors M1 and M2 are designed to have stronger strength than the transistors M3 and M4; that is, comparing with the transistor M1 (M2), the transistor M3 (M4) has longer or narrower channel, less driving capability and larger source-drain turn-on resistance.

With the embodiment of FIG. 1, please refer to FIG. 2 which illustrates operations of the RAM 101 by related signals and states of the power controller PC1(n). The RAM 101 alternately works in a Read mode (labeled as "read" in FIG. 2), a Standby mode ("standby") and a Write mode ("write"). When the RAM 101 works in the Standby mode, the word-line WL(m) (as well as WL(m')) will be kept at logic 0 without accessing any cells; the bit-lines BL(n) and BLB(n) stay in logic 1 of high voltage (e.g., the operation voltage VDD), the Write control signal WEB is logic 1. Through logic operations of the NOR gates NR1 and NR2, the transistors M1 and M2 are turned on (labeled as "on" in FIG. 2) to respectively connect the supply nodes np1 and np2 to the operation voltage VDD, thus the voltages VVDD1 and VVDD2 equal the operation voltage VDD. Therefore, the inverters iv1 and iv2 in the cells U(m,n) and U(m',n) work normally to latch data.

The RAM 101 works in the Read mode to read data of the cell U(m,n). In this mode, the Write control signal WEB remains logic 1 so the voltages VVDD1 and VVDD2 still equal the operation voltage VDD. The bit-lines BL(n) and BLB(n) are first pre-charged to high voltage of logic 1, and then put into floating state when Read operation begins. The selected word-line WL(m) goes high to logic 1 to turn on the pass-transistors T1 and T2 in the cell U(m,n), so the voltages of the bit-lines BL(n) and BLB(n) can respectively track those of the data storage nodes Q and QB, and their states are therefore marked with "x", in FIG. 2. For example, assuming the nodes Q and QB of the cell U(m,n) respectively store logic 1 and logic 0; when Read operation starts to turn on the transistor T2, turned-on transistor N2 tends to keep the node QB in the logic 0 state, but the transistor T2 connects node QB to node nb2 (in floating 1 state); the source-drain turn-on resistance of the transistor T2 and that of the transistor N2 forms a voltage divider and the voltage of QB rises. If the voltage of QB (commonly called Read disturb voltage) rises too high (i.e. above the trip voltage of the opposite inverter iv1), the data in the cell can be erroneously flipped. Therefore, circuit design will arrange a weaker transistor T2 (T1) to minimize the Read disturb voltage at the cell data storage node.

The RAM 101 works in the Write mode to write a bit of data to the cell U(m,n). Using writing logic 1 ("write "1"" in FIG. 2) as an example, logic 1 data write will drive node Q to logic 1 of high voltage, and node QB to logic 0 of low voltage. When Write operation starts, the bit-line BL(n) holds logic 1 (the data to be written), the bit-line BLB(n) is driven to logic 0 by the Write driver (not shown in the figure); the selected word-line WL(m) goes high to logic 1 to turn on the pass-transistor T1 and T2, and the Write control signal WEB is set to logic 0. Assuming the node Q originally stores logic 0 of low voltage and the complementary node QB stores logic 1 of high voltage. When Write operation starts, turned-on transistor P2 tends to keep the node QB in logic 1 state, and turned-on transistor N1 tends to keep the node Q in logic 0 state. To successfully complete data writing (i.e. flipping voltages of the nodes Q and QB), the pass-transistor T2 must compete with P2 to pull down the voltage of node QB below the trip voltage of the opposite inverter iv1, and P1 and T1 must then compete with N1 to pull-up the voltage of node Q to logic 1 state. However, the pass-transistor T1 and T2 are weak, so it is difficult for them to effectively drive voltage transitions for the nodes Q and QB.

Nevertheless, when Write operation starts, with operation of the power controller PC1(n), logic 0 of the bit-line BLB(n) and logic 0 of the Write control signal WEB will turn off transistor M2 of the power-switch 21b (denoted by "off" in FIG. 2) through NOR gate NR2, and only transistor M4 is left to control the voltage VVDD2 of node np2. Comparing with transistor M2, transistor M4 is designed to be weaker; so the voltage VVDD2 of node np2 becomes lower. Therefore, the voltage of node ns2 supplied to source of transistor P2 is lowered to decrease its conduction, and it is easier for the pass-transistor T2 to pull the node QB down to low voltage of logic 0. Moreover, because the voltage of node QB is lower, it is harder for transistor N1 to keep node QB in low voltage, and easier for P1 and T1 to pull up the voltage of node Q.

In addition, when Write operation starts, logic 1 of bit-line BL(n) and logic 0 of the Write control signal WEB keep the transistor M1 of the power-switch 21a turned-on through NOR gate NR1, so the voltage VVDD1 remains the same as the operation voltage VDD for normal voltage supply of the transistor P1 of the inverter iv1. That is, when the voltage of node QB starts to fall, the transistor P1 begins to turn on with normal operation voltage VDD, such that the voltage of node Q can be pulled up rapidly to the operation voltage VDD. Through the cross-coupled latch feedback mechanism, the rapid rise of the node Q voltage turns on transistor N2 to further facilitate pulling-down of the node QB voltage to the logic 0 state of voltage VSS.

In other words, with operation of the power controller PC1(n) while writing logic 0 to the node QB, the power-switch 21b corresponding to the transistor P2 is turned off to lower the voltage of node np2, thus the voltage VVDD2 supplied to the source of transistor P2 is lowered; whereas the voltage VVDD1 supplied to the source of transistor P1 remains unchanged at operation voltage VDD. All these operations can effectively increase speed and efficiency of data write, and improve static noise margin. Symmetrically, for writing logic 0 to the cell U(m,n), i.e., writing logic 1 to the node QB and logic 0 to the node Q, the power-switch 21a corresponding to transistor P1 turns off to lower the voltage of node np1, thus the voltage VVDD1 supplied to the source of transistor P1 becomes lower than the operation voltage VDD, while the voltage VVDD2 supplied to the source of transistor P2 remains unaffected. That is, the power-switches 21a and 21b work independently to respectively control source voltage supplies of the inverters iv1 and iv2 of a same column; according to the data (logic 0/1 or logic 1/0) held in the bit-line BL(n)/BLB(n), only one of the two inverters iv1 and iv2 is supplied with lowered source voltage, and the other still receives unchanged source voltage supply to maintain its driving ability and feedback mechanism of cross-coupled latch structure.

In a prior art, both the two inverters of each cell are commonly supplied with lowered voltage during data write. For example, while writing logic 0 to node QB, voltages supplied to sources of both transistors P1 and P2 are simultaneously lowered. Though conduction of the transistor P2 is reduced to decrease its ability to hold the voltage of node QB, conduction of the transistor P1 is also degraded; and its ability to pull up node Q suffers. On the contrary, a dynamic adjustment with awareness of input data (i.e. data to be written) is adopted in the invention to lower supply voltage for only one of the two inverters, thus effectively improves the data writing. Moreover, because only one inverter in the cell is switched to alternate source voltage supply, power consumption for switching supply voltages is lowered, and the switching can be completed in a shorter time.

In the RAM 101, when the power switch 21a (21b) turns off, the voltage VVDD1 (VVDD2) of the node np1 (np2) will be affected by the leakage currents of cells of a column. For example, when logic 0 is written to node QB of cell U(m,n) through bit-line BLB(n), transistor M2 of the power-switch 21b is turned off and the voltage of node np2 is lowered and maintained by the small power-keeper M4. Because the node np2 is coupled to all the cells of the same column, like the cells U(m,n) and U(m',n), through a power routing, equivalent capacitance of the power routing holds the voltage of node np2 with its charges; as the transistors P2 in the cells, such as cells U(m,n) and U(m',n), all drain leakage currents from the power routing, the voltage VVDD2 of node np2 drops due to the leakage currents. By proper design of the power-keeper transistor M4, the transistor M4 can conduct/supply an appropriate current I4 (FIG. 1) to compensate for leakage currents of the cells in the column, and the voltage VVDD2 of node np2 can be kept at an appropriate lower-than-VDD voltage without excessive drop, and the data stored in each cell of the column can be well maintained. Symmetrically, when the transistor M1 in the power-switch 21a turns off, the power-keeper transistor M3 provides a current I3 to compensate for cell leakage currents of the column.

Figure 3:
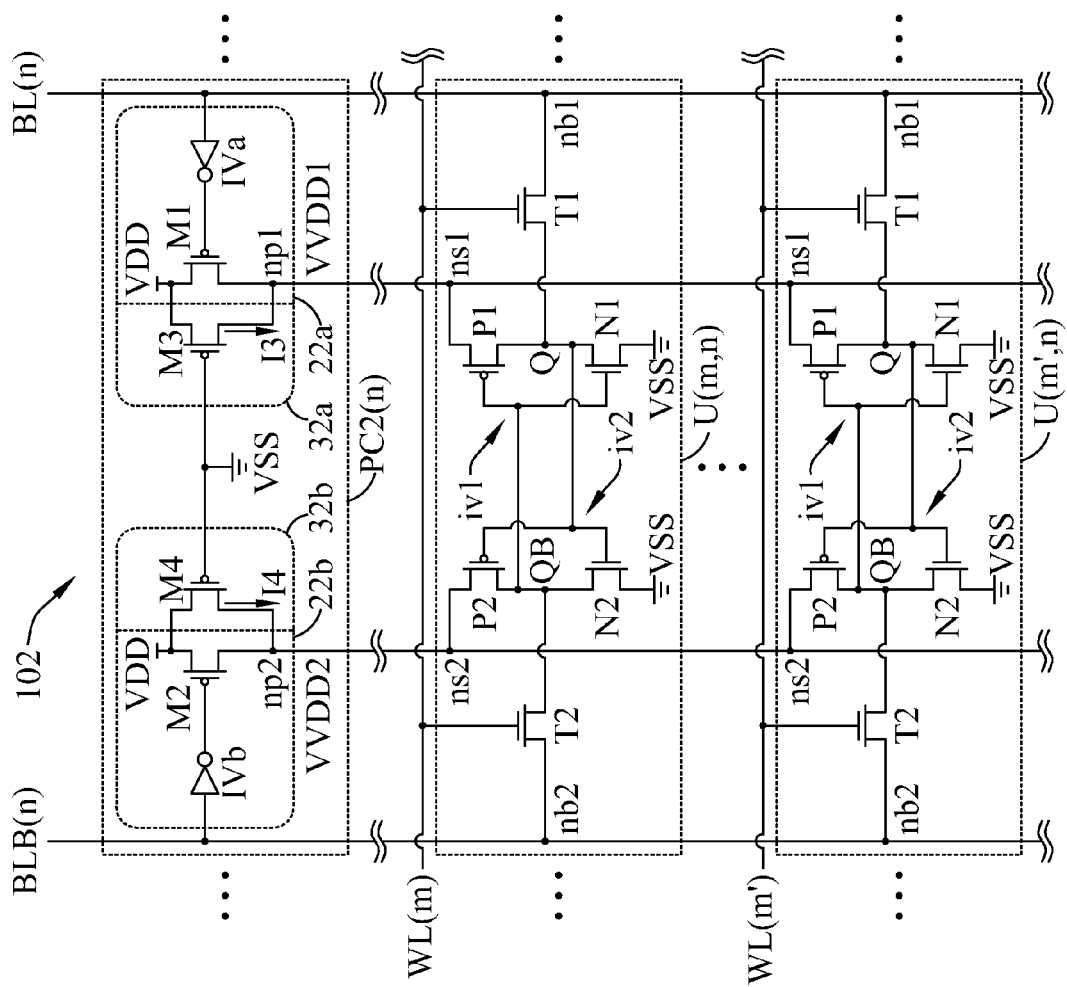

Please refer to FIG. 3 and FIG. 4; FIG. 3 demonstrates a RAM 102 according to another embodiment of the invention, and FIG. 4 illustrates mode operations of RAM 102. Similar to RAM 101 of FIG. 1, RAM 102 includes a corresponding power controller PC2(n) for the cells of the n-th column, such as the cells U(m,n) and U(m',n). Nodes np1 and np2, as two supply nodes of the power controller PC2(n), are respectively coupled to nodes ns1 and ns2 of each cell of the column, so the voltages VVDD1 and VVDD2 can be respectively supplied to sources of transistors P1 and P2. The power controller PC2(n) also includes two power-switches 22a and 22b, as well as two power-keepers 32a and 32b. The power-keepers 32a and 32b are respectively implemented by transistors M3 and M4 (e.g., a pair of matched p-channel MOS transistors); gates and sources of transistors M3 and M4 are respectively coupled to the operation voltages VSS and VDD, and drains of transistors M3 and M4 respectively coupled to node np1 and np2 symmetrically. The power-switch 22a includes a transistor M1 and an inverter IVa; the inverter IVa inverts the data voltage of the bit-lie BL(n) to control gate of transistor M1. The transistor M1, e.g., a p-channel MOS transistor, works as a power-switch transistor with its source and drain respectively coupled to the operation voltage VDD and the supply node np1. Symmetrically, the power-switch 22b includes a transistor M2, e.g., a transistor matched with transistor M1, and an inverter IVb, so transistor M2 determines, according to inverted voltage of the bit-line BLB(n), whether to connect the operation voltage VDD to supply node np2 through its source-drain.

Operations of the power controller PC2(n) are similar to those of the power controller PC1(n) of FIG. 1, the power controller PC2(n) provides two independent voltages VVDD1 and VVDD2 as source voltage supply respectively for the inverters iv1 and iv2 of the cells in a column. However, the Write control signal WEB is eliminated, thus the power-switch 22a controls the voltage VVDD1 according to the voltage level of bit-line BL(n), and the power-switch 22b controls the voltage VVDD2 according to the voltage level of bit-line BLB(n) only. As shown in FIG. 4, operations of the power controller PC2(n) are similar to those of the power controller PC1(n) during Write operation, so the power controller PC2(n) inherits advantages of the power controller PC1(n). For example, while writing logic 1 to the cell U(m,n), the bit-line BLB(n) is pulled down to logic 0 of low voltage, then the inverter IVb works to turn off transistor M2 to lower the voltage at node np2. Due to leakage of the cells in the column, the voltage VVDD2 is pulled down; meanwhile, transistor M4 (the power-keeper 32b) provides a current I4 to compensate for leakage currents of the column, so the voltage VVDD2 is kept at an appropriate level lower than the operation voltage VDD. The lowered voltage VVDD2 reduces conduction of transistors P2 and N1 of cell U(m,n) to improve writing of cell U(m,n) without affecting data stored in the other cells in the same column, e.g., the cell U(m',n). On the other side, the turned-on transistor M1 keeps VVDD1 at the operation voltage VDD, so the conducting strength of transistors P1 and N2 remains unchanged for rapid pull-up of node Q and the cross-coupled latch feedback mechanism.

While RAM 102 reads data of cell U(m,n), if logic 1 is stored in cell U(m,n) (labeled as "read "1"" in FIG. 4), nodes Q and QB store logic 1 and logic 0 respectively; during Read operation, the voltage of bit-line BLB(n) will be pulled down, transistor M2 in power-switch 22b turns off; at this time, the leakage from cells of the column discharges node np2 to decrease the voltage VVDD2. Comparing with the operation of writing logic 1, however, the voltage drop of VVDD2 during reading logic 1 is smaller and slower since BLB(n) is pulled-down by T2 and N2 of the selected cell U(m,n) in Read operation; whereas in Write operation BLB(n) is pulled down by the much stronger Write driver (not shown in the figure). As such, the effect of lowered VVDD2 on the cells of the same column is smaller in Read operation. In other words, by proper circuit design, data read of logic 1 can be executed correctly without affecting data stored in other cells of the same column once transistor M4 of power-keeper 32b can maintain a proper level of the voltage VVDD2 during data write of logic 1. Symmetrically, as transistor M3 can maintain a proper level of the voltage VVDD1 during data write of logic 0, data read of logic 0 will work correctly. Moreover, through proper circuit design, the threshold of the sensing amplifiers (not shown) for determining logic 0 during Read operation can be set higher than the trip voltage of inverters IVa and IVb for triggering an output transition from logic 0 to logic 1, to further ensure correct data read. For example, during data read of logic 1, when the voltage of the bit-line BLB(n) decreases to (VDD−dV), where dV is a pre-set voltage drop, it is recognized as logic 0 by the sensing amplifier. On the other hand, the voltage level (VDD−dV) is still recognized as logic 1 by inverter IVb, thus inverter IVb keeps a logic 0 output to transistor M2, and transistor M2 maintains on.

Figure 5:
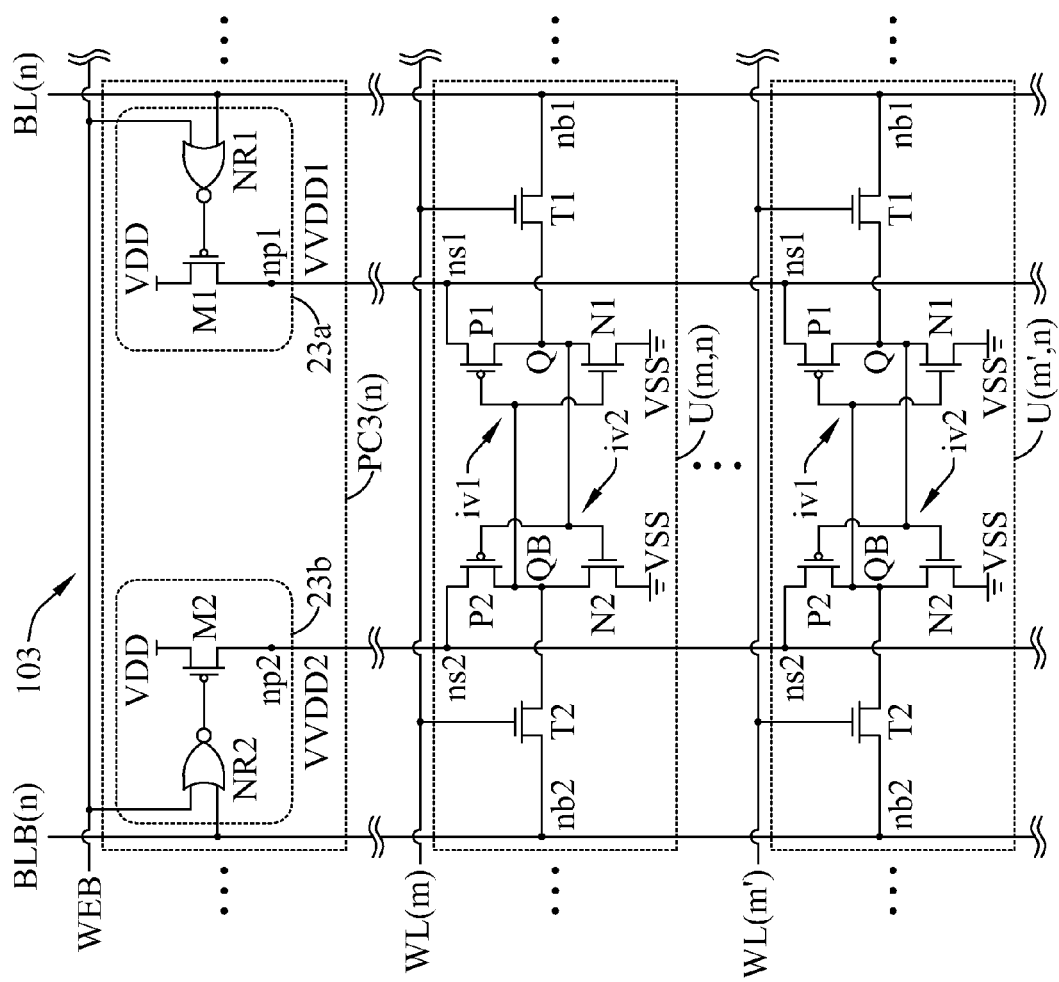

Please refer to FIG. 5 and FIG. 6; the former illustrates a RAM 103 according to an embodiment of the invention, and the latter demonstrates the operation modes of RAM 103. The RAM 103 includes a power controller PC3(n) providing voltages VVDD1 and VVDD2 for cells, like cells U(m,n) and U(m',n), of the n-th column. Similar to the power-switches 21a and 21b in the power controller PC1(n) of FIG. 1, the power controller PC3(n) also includes power-switches 23a and 23b, but excludes power-keepers. Under the control of a Write control signal WEB, the power-switches 23a and 23b independently provide the two independent voltages VVDD1 and VVDD2 respectively for the inverters iv1 and iv2 of the same column. For example, when logic 1 is written to the cell U(m,n), the Write control signal WEB and the bit-line BLB(n) are logic 0, so transistor M2 in power-switch 23b is turned off; node np2 is thus left floating, and the voltage VVDD2 is lowered to improve data write. With proper circuit design, correct data write without impact on other unselected cells in the same column can be ensured if node np2 has enough equivalent/parasitic capacitance to hold appropriate amount of charges against discharge owing to leakage currents of the cells of the column while transistor M2 is off.

Figure 7:
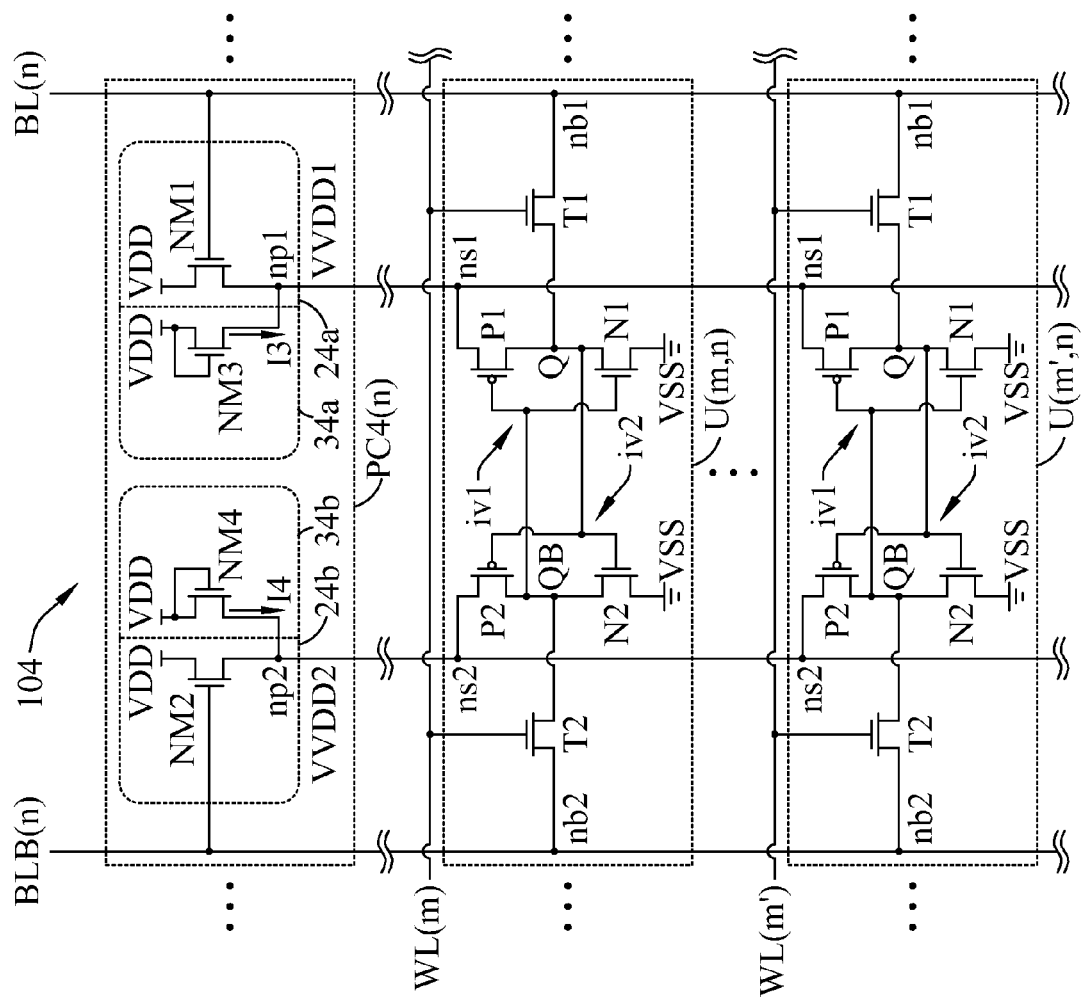

Please refer to FIG. 7 and FIG. 8; FIG. 7 illustrates a RAM 104 according to another embodiment of the invention, and FIG. 8 shows operations of the RAM 104. The RAM 104 also includes a power controller PC4(n) for the cells of the n-th column. The power controller PC4(n) includes power-switches 24a and 24b, as well as power-keepers 34a and 34b. The power-switches 24a and 24b can be respectively implemented by transistors NM1 and NM2, with the transistors NM1 and NM2 being matched n-channel MOS transistors. The transistor NM1 has a drain, a gate and a source respectively coupled to the operation voltage VDD, the bit-line BL(n) and a supply node np1; symmetrically, the transistor NM2 has a drain, a gate and a source respectively coupled to the operation voltage VDD, the bit-line BLB(n) and a supply node np2. The power-keepers 34a and 34b can be respectively implemented by transistors NM3 and NM4, e.g., two diode-connected matched n-channel MOS transistors with sources respectively coupled to the nodes np1 and np2, and drains and gates commonly coupled to the operation voltage VDD.

According to data voltage of the bit-line BL(n), the power-switch 24a determines whether to connect the operation voltage VDD to node np1; for example, as shown in FIG. 8, when the RAM 104 sets the bit-line BL(0) to logic 0 to write logic 0 to the cell U(m,n), transistor NM1 in the power-switch 24a is off, and the voltage VVDD1 of the node np1 supplied to each cell is lowered to facilitate Write operation. During either data read or write, transistor NM3 in power-keeper 34a provides a compensate current I3 when transistor NM1 is off or is of low conduction, so the voltage VVDD1 can be kept at an appropriate level lower than the operation voltage VDD without affecting the data stored in other cells in the same column. Symmetrically, the power-switch 24b and power-keeper 34b can dynamically control the voltage VVDD2 at node np2 according to data of bit-line BLB(n).

Figure 9:
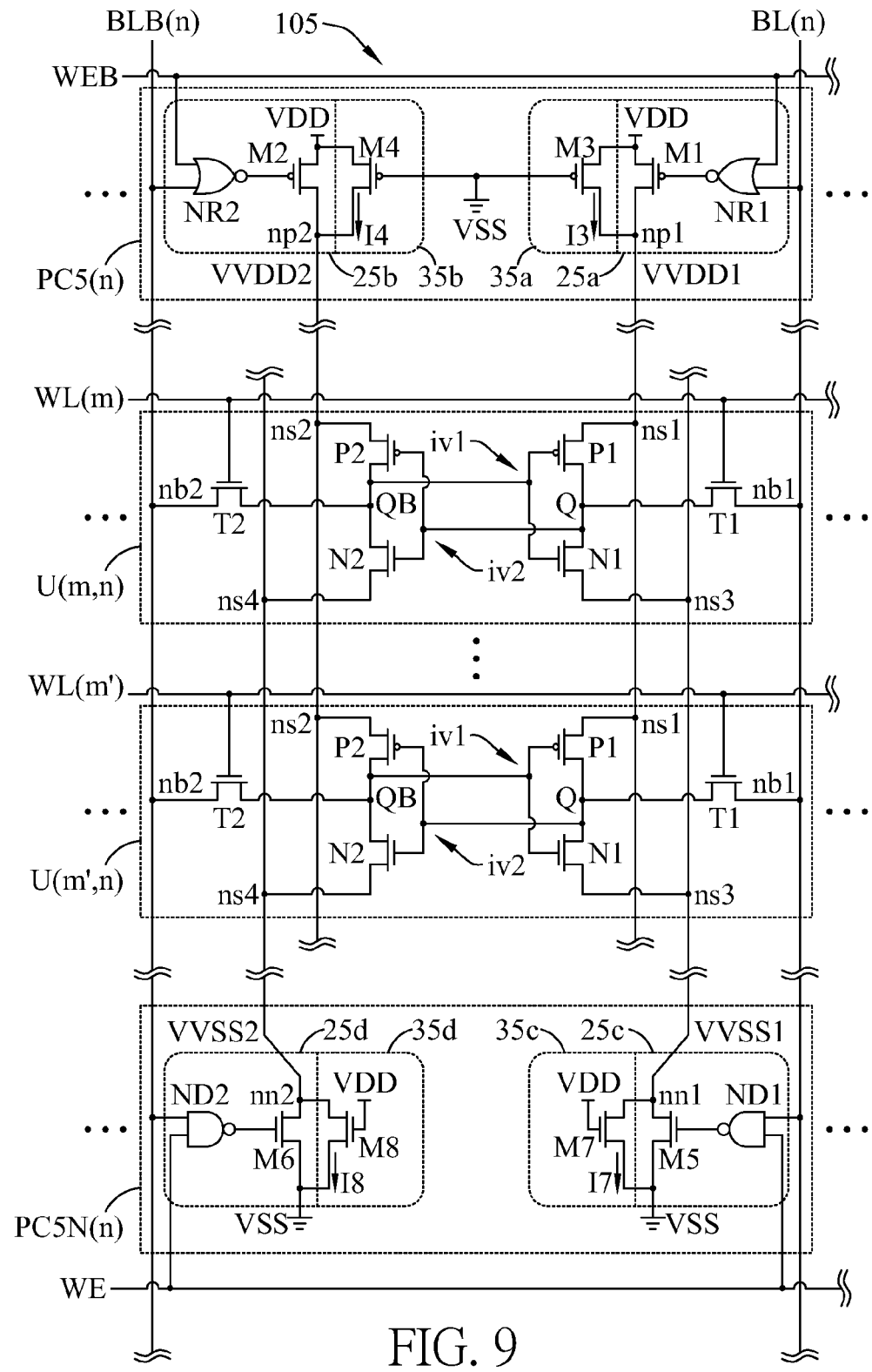

Please refer to FIG. 9 and FIG. 10; the former illustrates a RAM 105 according to another embodiment of the invention, and the latter demonstrates the operations of RAM 105. In aforementioned embodiments, the power controllers of RAMs 101 to 104 are utilized to respectively provide independent voltages VVDD1 and VVDD2 to sources of transistors P1 and P2 in cells of a same column, with the voltages VVDD1 and VVDD2 dynamically adjusted according to data voltages of the bit-lines. In the embodiment shown in FIG. 9 and FIG. 10, the RAM 105 not only includes a power controller PC5(n) supplying the voltages VVDD1 and VVDD2 for cells, e.g., cells U(m,n) and U(m',n) of the n-th column, but also includes an additional power controller PC5N(n) providing voltages VVSS1 and VVSS2 respectively for transistors N1 and N2 in each cell of the column.

In RAM 105, the circuit architecture and arrangement of the power controller PC5(n) is similar to those of the power controller PC1(n) of FIG. 1. In cell U(m,n) (as well as cell U(m',n)), transistors P1 and P2 of inverters iv1 and iv2 are coupled to nodes np1 and np2 of the power controller PC5(n) respectively through nodes ns1 and ns2. The voltage VVDD1 and VVDD2 at nodes np1 and np2 of the power controller PC5(n) provide voltages respectively supplied to sources of transistors P1 and P2. The power controller PC5(n) includes power-switches 25a and 25b, and power-keepers 35a and 35b. The power-switch 25a determines whether to connect node np1 to the operation VDD according to voltages of Write control signal WEB and bit-line BL(n); symmetrically, power-switch 25b determines whether to connect node np2 to the operation VDD according to voltages of Write control signal WEB and bit-line BLB(n). When power-switch 25a turns off M1, power-keeper 35a provides a current to keep the voltage VVDD1 at an appropriate level lower than the operation voltage VDD without excessive voltage drop; similarly, power-keeper 35b helps to keep voltage VVDD2 at an appropriate low level when M2 turns off and the voltage at node np2 is lowered.

Furthermore, the power controller PC5N(n) supplies the voltages VVSS1 and VVSS2 respectively through two nodes nn1 and nn2 as two supply nodes; with sources of transistors N1 and N2 in inverters iv1 and iv2 of cell U(m,n) or U(m',n) respectively coupled to nodes nn1 and nn2 through nodes ns3 and ns4 (i.e. the voltage VVSS1 and VVSS2 provide independent source voltages respectively to transistors N1 and N2). The power controller PC5N(n) includes power-switches 25c and 25d, and power-keepers 35c and 35d. The power-switch 25c includes a transistor M5 and a NAND gate ND1; symmetrically, the power-switch 25d includes a transistor M6 and a NAND gate ND2. The transistors M5 and M6 can be a pair of matched n-channel MOS transistors with sources coupled to the operation voltage VSS. The NAND gate ND1 performs logic NAND operation between the voltages of bit-line BL(n) and another Write control signal WE (Write Enable), and then controls gate of transistor M5 accordingly. Based on the output of NAND gate ND1, transistor M5 determines whether to connect node nn1 to the operation voltage VSS through its drain and source. Symmetrically, NAND gate ND2 performs NAND operation between the voltages of bit-line BLB(n) and Write control signal WE, so transistor M6 accordingly controls connection between node nn2 and the operation voltage VSS. The power-keepers 35c and 35d are respectively implemented by transistors M7 and M8; these two transistors can be matched n-channel MOS transistors with gates and sources respectively coupled to the operation voltages VDD and VSS, and drains respectively coupled to nodes nn1 and nn2. When transistor M5 is turned off, leakage currents from the cells in the same column inject into node nn1 to raise the voltage VVSS1 higher than the operation voltage VSS, and transistor M7 drains a proper current I7 so the voltage VVSS1 is kept at an appropriate level higher than the operation voltage VSS. Symmetrically, when transistor M6 of power-switch 25d is off, transistor M8 in power-keeper 35d conducts a current I8 to help maintaining a proper level of the voltage VVSS2.

Cooperation between the power controllers PC5(n) and PC5N(n) is described as follows. The Write control signals WEB and WE are mutually inverted; when RAM 105 works in Read or Standby modes, the write control signal WE is disabled to logic 0 while the other Write control signal WEB is enabled to logic 1. In the power controller PC5(n), the Write control signal WEB of logic 1 turns on transistors M1 and M2, thus the voltages VVDD1 and VVDD2 stay at the same level as the operation voltage VDD to provide normal supply to transistors P1 and P2 in each cell of a same column. Similarly, the Write control signal WE of logic 0 turns on transistors M5 and M6 in the power controller PC5N(n), so the voltages VVSS1 and VVSS2 maintain the same level as the operation voltage VSS to provide normal source voltage supply respectively for transistors N1 and N2 in each cell of the same column.

When RAM 105 performs Write operation, the Write control signal WE is enabled to logic 1 while the Write control signal WEB complementarily disabled to logic 0, so the power controllers PC5(n) and PC5N(n) are allowed to respectively adjust the voltages VVDD1, VVDD2, VVSS1 and VVSS2 according to the voltage levels of bit-lines BL(n) and BLB(n). For example, when logic 1 is to be written to the cell U(m,n), bit-line BLB(n) at voltage level of logic 0 turns off transistor M2 in the power controller PC5(n), and the voltage VVDD2 is lowered; on the other hand, bit-line BL(n) at voltage level of logic 1 turns on transistor M1, so the voltage VVDD1 stays at the same normal level as the operation voltage VDD. In addition, logic 1 of bit-line BL(n) and logic 1 of Write control signal WE turn off transistor M5 in power-switch 25c through NAND gate ND1, and the voltage VVSS1 drifts higher than the operation voltage VSS; transistor M7 works to keep the voltage VVSS1 from drifting too high, so the unselected cells in the same column can correctly maintain their stored data. On the other hand, logic 0 of bit-line BLB(n) keeps transistor M6 in power-switch 25d to be on as normal, and the voltage VVSS2 is kept at the same normal level as the operation voltage VSS.

Assuming cell U(m,n) originally stores logic 0 with its nodes Q and QB respectively holding logic 0 and logic 1. When RAM 105 writes logic 1 to cell U(m,n), as discussed above, the voltage VVDD2 will be lowered to decrease conduction of transistor P2 in cell U(m,n), so the voltage of node QB can be readily pulled down by the pass-gate transistor T2. Furthermore, as the voltage VVSS1 is raised, conduction of transistor N1 is degraded, so the voltage of node Q can be readily pulled up by transistor P1. Meanwhile, the voltage VVDD1 stays at the same level as the operation voltage VDD, thus transistor P1 maintains its normal conduction strength for pulling up node Q to high voltage of logic 1; similarly, the voltage VVSS2 maintains at the same normal level as the operation voltage VSS, so transistor N1 turns on with normal conduction strength to pull down the node QB to low voltage of logic 0. That is, with individual control of the voltages VVDD1, VVDD2, VVSS1 and VVSS2 by the power controller PC5(n) and PC5N(n), RAM 105 of the invention effectively enhances the efficiency of data write.

In RAM 105, the power controller PC5(n) and PC5N(n) can be regarded as a header power controller and a footer power controller, respectively. The power controller PC5N(n) in FIG. 9 is only one embodiment of the invention; other embodiments can be derived from the power controllers PC2(n), PC3(n) and PC4(n) in FIG. 3, FIG. 5 and FIG. 7. In addition, the RAMs shown in FIG. 3, FIG. 5 and FIG. 7 can include footer power controllers similar to the power controller PC5N(n) for individual source voltage supply switching of each of transistors N1 and N2 in each cell of a same column.

Figure 11:
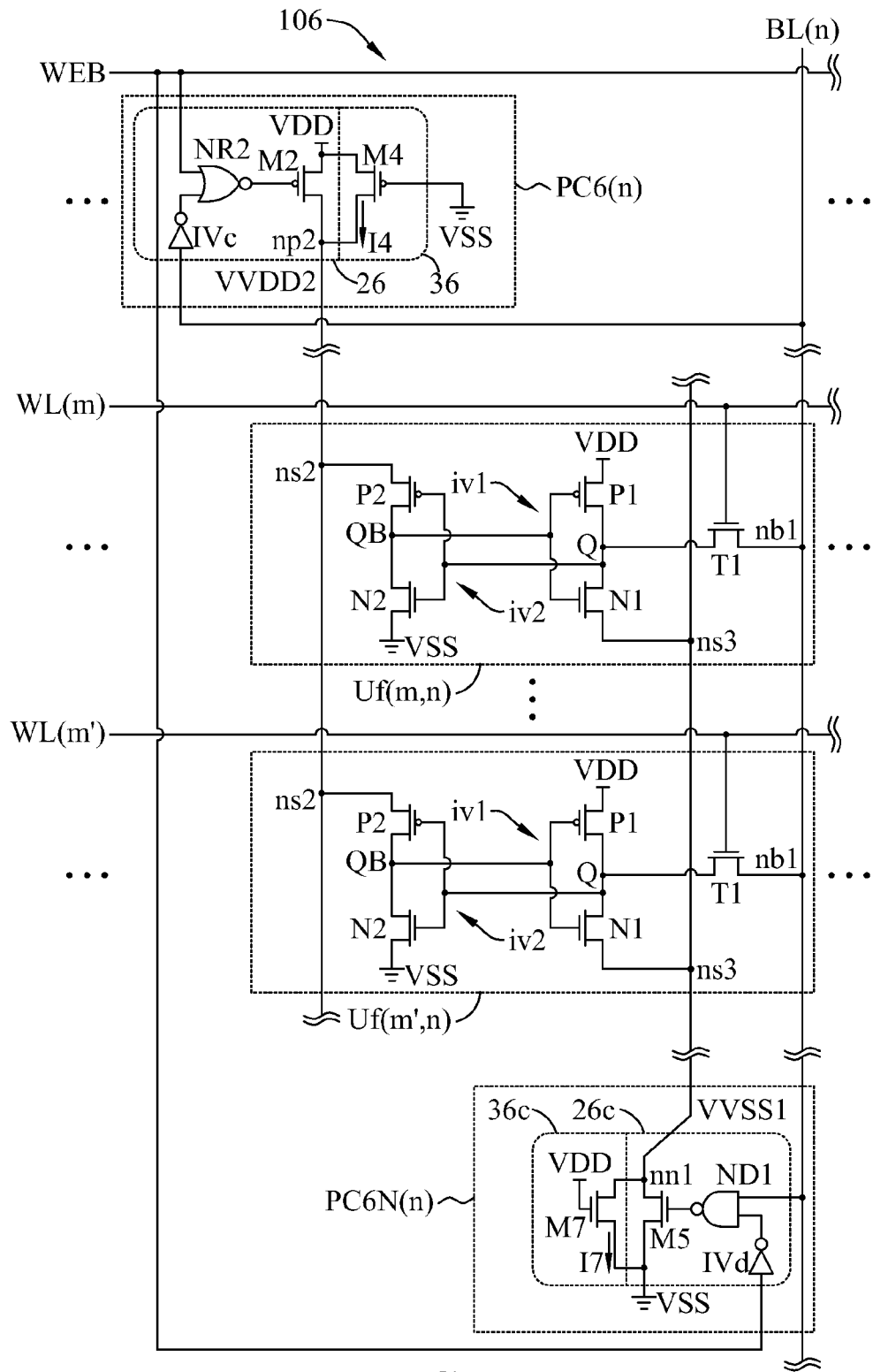

Please refer to FIG. 11 and FIG. 12; the former illustrates a RAM 106 of 5T cells according to an embodiment of the invention, while the latter demonstrates operations of RAM 106. The RAM 106 includes cells arranged in a plurality of rows and a plurality of columns, such as cells Uf(m,n) and Uf(m',n) of the n-th column shown in FIG. 11. Similar to the 6T cell U(m,n), the cell Uf(m,n) includes two inverters iv1 and iv2 respectively formed by transistors P1, N1 and transistors P2, N2 with the nodes Q and QB as two data storage nodes. In RAM 106, however, cells Uf(m,n) and Uf(m',n) of the same column are accessed through a signal bit-line BL(n), so each cell Uf(m,n) (and Uf(m',n)) has a single pass-gate transistor T1 with a source and a drain coupled between nodes nb1 and Q, and a gate coupled to a word-line WL(m), such that transistor T1 determines whether to connect node Q to bit-line BL(n) according to voltage of word-line WL(m).

For data write of a 5T cell, it is more difficult to write logic 1 (logic 1 for node Q and logic 0 for node QB) since there is no complementary bit-line for active voltage control of node QB, and logic 1 can only be written by bit-line BL(n) through pass-gate transistor T1. To enhance data write of logic 1, RAM 106 includes power controllers PC6(n) and PC6N(n) for cells of the n-th column. The power controller PC6(n) includes a power-switch 26 and a power-keeper 36 to provide a voltage VVDD2 to node np2; as node np2 is coupled to a node ns2 of each cell, e.g., Uf(m.n) or Uf(m',n), the voltage VVDD2 can be supplied to source of transistor P2 in each cell of a same column. In the power-switch 26, a transistor M2, e.g., a p-channel MOS transistor, implements a power-switch transistor with a source and a drain respectively coupled to the operation voltage VDD and node np2. An inverter IVc and a NOR gate NR2 form a logic circuit, so transistor M2 determines whether to connect node np2 to the operation voltage VDD according to voltages of a Write control signal WEB and bit-line BL(n). The power-keeper 36 can be implemented with a transistor M4, e.g., a p-channel MOS transistor, with a source, a gate and a drain respectively coupled to the operation voltage VDD, the operation voltage VSS and node np2. Comparing with transistor M2, transistor M4 can be a weaker transistor. When transistor M2 is off, the voltage VVDD2 drifts away from the operation voltage VDD, and transistor M4 provides a current I4 to compensate for leakage currents from the cells of the same column which discharge node np2, so the voltage VVDD2 stays at an appropriate level lower than the operation voltage VDD, and data stored in the unselected cells of the same column can be maintained.

Based on similar design, the power controller PC6N(n) includes a power-switch 26c and a power-keeper 36c to control the voltage VVSS1 of node nn1. As node nn1 is coupled to node ns3 in each cell of the same column, the voltage VVSS1 is supplied to source of transistor N1 in each cell of the same column. The power switch 26c includes a transistor M5, e.g., an n-channel MOS transistor, and a NAND gate ND1 and an inverter IVd forming a logic circuit. A drain and a source of transistor M5 are coupled to node nn1 and the operation voltage VSS, respectively. NAND gate ND1 performs logic NAND operation of bit-line BL(n) voltage level and the inverted Write control signal WEB, and transistor M5 controls, according to result of the NAND operation, connection between node nn1 and the operation voltage VSS. The power-keeper 36c can be implemented by a transistor M7, e.g., an n-channel MOS transistor, with a drain, a gate and a source respectively coupled to node nn1, the operation voltages VDD and VSS. Comparing with transistor M5, transistor M7 can be a weaker transistor. When transistor M5 is off, the voltage VVSS1 drifts away from the operation voltage VSS; and transistor M7 provides a current I7 to compensate for leakage currents from the cells of the same column which charge node nn1, so the voltage VVSS1 stays at an appropriate level higher than the operation voltage VSS, and data stored in the unselected cells of the same column can be well maintained.

RAM 106 works as follows. While in Read or Standby modes, the Write control signal WEB is set to logic 1. The Write control signal WEB of logic 1 turns on transistors M2 and M5 regardless of whether bit-line BL(n) is logic 0 or 1. Therefore, the power controller PC6(n) and PC6N(n) respectively keep the voltage VVDD2 and VVSS1 at the same levels as the operation voltages VDD and VSS, so the cells of the same column can maintain normal voltage supply.

During data write, the Write control signal WEB is changed to logic 0, so the power controller PC6(n) and PC6N(n) are allowed to switch the voltages VVDD2 and VVSS1 according to data voltage of bit-line BL(n). When bit-line BL(n) is logic 0 to write logic 0 to cell Uf(m,n), transistors M2 and M5 remain on, so the voltages VVDD2 and VVSS1 respectively stay at the normal operation voltages VDD and VSS. On the contrary, when bit-line BL(n) is at logic 1 to write logic 1 to cell Uf(m,n), both transistors M2 and M5 are turned off; as a result, the voltage VVDD2 at node np2 becomes lower while the voltage VVSS1 at node nn1 becomes higher. In cell Uf(m,n), lower voltage VVDD2 weakens conduction of transistor P2, so node QB can be discharged to logic 0 by transistor N2 more easily; while higher voltage VVSS1 degrades conduction of transistor N1, thus node Q can be readily charged to logic 1 by pass-transistor T1 to facilitate data write of logic 1.

Figure 13:
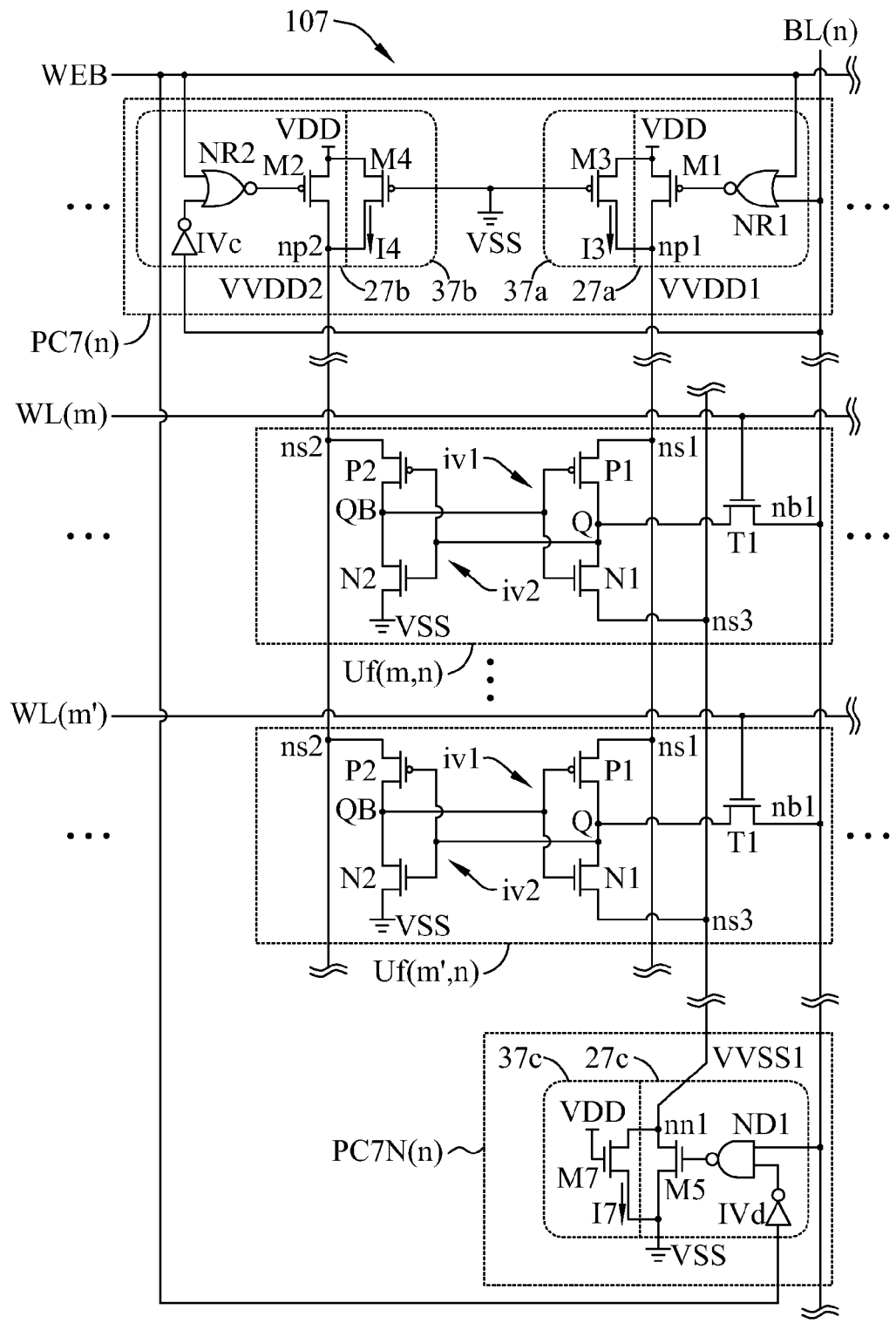

Following the embodiment of FIG. 11, please refer to FIG. 13 and FIG. 14; the former illustrates a RAM 107 according to an embodiment of the invention, the latter demonstrates operations of RAM 107. Similar to RAM 106 of FIG. 11, RAM 107 adopts static 5T cells and includes power controllers PC7(n) and PC7N(n) for the n-th column. However, the power controllers PC6(n) and PC6N(n) of RAM 106 mainly addresses enhancement of writing logic 1, so only one set of power-switch/keeper is included. For full enhancement of writing both logic 1 and logic 0, the power controller PC7(n) of RAM 107 includes two sets of power-switch/keeper. As shown in FIG. 13, the power controller PC7(n) has two power-switches 27a, 27b and two power-keepers 37a and 37b. Essential functions and architectures of power-switch 27b and power-keeper 37b are the same as those of power-switch 26 and power-keeper 36 of FIG. 11. Power-switch 27a and power-keeper 37a work to control the voltage VVDD1 of node np1, which is supplied to sources of transistors P1 of cells of a same column.

The power-switch 27a includes a transistor M1 and a NOR gate NR1; transistor M1 matches transistor M2, the NOR gate NR1 performs logic NOR operation between the data of bit-line BL(n) and Write control signal WEB, so transistor M1 determines, according to the result of logic NOR operation, whether to connect node np1 to the operation voltage VDD. Transistor M3 in power-keeper 37a matches transistor M4 in power-keeper 37b; when transistor M1 is off, transistor M3 provides a current I3 to maintain an appropriate level of the voltage VVDD1.

RAM 107 performs data write as follows. While writing logic 1 to cell Uf(m,n), logic 0 of Write control signal WEB and logic 1 of the bit-line BL(n) turn on transistor M1 and turn off transistors M2 and M5. Thus, the voltage VVDD2 is lowered, the voltage VVSS1 is raised, and the voltage VVDD1 is kept at a normal level the same as the operation voltage VDD. Consequently, in cell Uf(m,n), conduction of transistors P2 and N1 are weakened, while conduction of transistor P1 remains unaffected to facilitate writing logic 1 to node Q1.

On the other hand, when logic 0 is written to Uf(m,n), logic 0 of bit-line BL(n) turns on transistors M2 and M5, and transistor M1 is turned off. Thus, the voltage VVDD1 is lowered, and conduction of transistor P1 in cell Uf(m,n) is weakened to speed up discharge of node Q by pass-gate transistor T1, and writing of logic 0 is enhanced. By operations mentioned above, RAM 107 improves writing of both logic 0 and logic 1.

Figure 15:
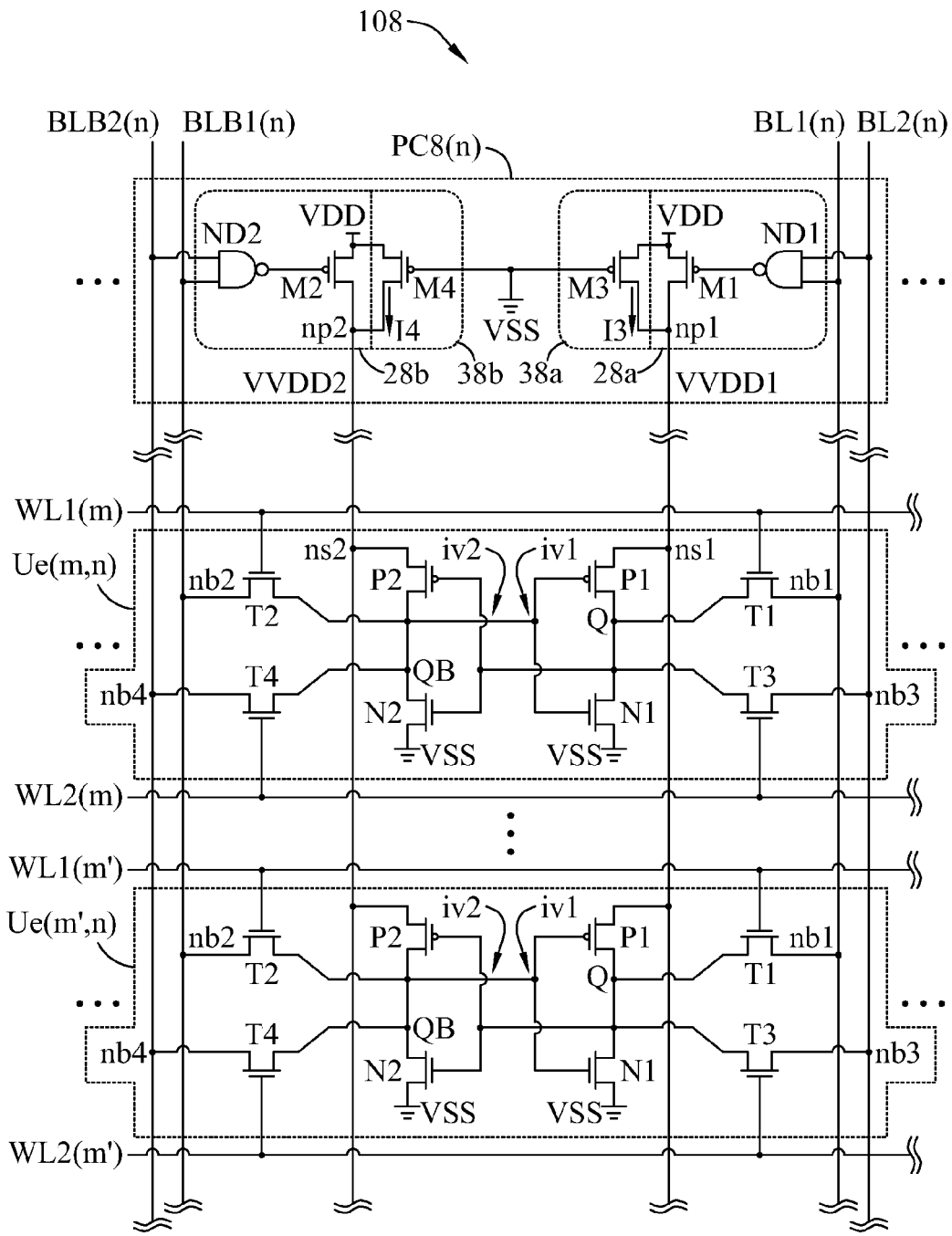

Please refer to FIG. 15 and FIG. 16; the former illustrates a RAM 108 of static 8T dual-port cells according to an embodiment of the invention, and the latter demonstrates operations of the RAM 108. The RAM 108 includes cells arranged in multiple columns, such as cells Ue(m,n) and Ue(m',n) of the n-th column. Taking cell Ue(m,n) as an example, it is a two-port static cell including transistors P1 and N1 forming an inverter iv1, and transistors P2 and N2 forming another inverter iv2; inverters iv1 and iv2 form a latch architecture for storing a data bit at nodes Q and QB. Nodes nb1 and nb2 of cell Ue(m,n), as two differential bit nodes of a same port, are respectively coupled to a bit-line BL1(n) and a complementary bit-line BLB1(n); transistors T1 and T2, as two pass-gate transistors, respectively control whether to connect nodes Q and QB to bit-lines BL1(n) and BLB1(n) according to voltage of a word-line WL1(m). Similarly, nodes nb3 and nb4, as two differential bit nodes of another port, are respectively coupled to bit-lines BL2(n) and BLB2(n); pass-gate transistors T3 and T4, according to voltage of another word-line WL2(m), respectively determine whether to connect nodes Q and QB to another pair of bit-lines BL2(n) and BLB2(n). Using the 8T static cells, RAM 108 can implement a dual-port static RAM.

To enhance writing efficiency and to improve writing characteristics of 8T static cells, the RAM 108 in FIG. 15 includes power controllers respectively corresponding to columns of cells, such as the power controller PC8(n) corresponding to cells Ue(m,n) and Ue(m',n) of the n-th column. The power controller PC8(n) includes power-switches 28a and 28b, and power-keepers 38a and 38b, for controlling voltages VVDD1 and VVDD2 of nodes np1 and np2. Nodes np1 and np2 are respectively coupled to nodes ns1 and ns2 in each cell of the same column, such that the voltages VVDD1 and VVDD2, as two source supply voltages, are supplied to sources of transistors P1 and P2 in each cell. The power-switch 28a includes a transistor M1 and a NAND gate ND1; transistor M1, e.g., a p-channel MOS transistor, has a source and a drain respectively coupled to the operation voltage VDD and node np1, NAND gate ND1 performs logic NAND operation between data voltages of bit-lines BL1(n) and BL2(n), such that transistor M1 controls connection between node np1 and the operation voltage VDD according to the result of the NAND logic operation. The power-keeper 38a can be implemented by a transistor M3, e.g., a p-channel MOS transistor; comparing with transistor M1, transistor M3 is weaker. When transistor M1 turns off, the voltage VVDD1 is lowered, and M3 provides a current I3 to maintain a suitable level of the voltage VVDD1. Symmetrically, the power-switch 28b includes a transistor M2, e.g., a transistor matched with transistor M1, and a NAND gate ND2, so connection between node np2 and the operation voltage VDD can be controlled according to the result of logic NAND operation between bit-lines BLB1(n) and BLB2(n). The power-keeper 38b has a transistor M4, e.g., a transistor matched with transistor M3; when transistor M2 is off, M4 provides a current I4 to maintain an appropriate level of the voltage VVDD2.

RAM 108 operates as follows. While RAM 108 works in a Standby mode, bit-lines BL1(n), BL2(n), BLB1(n) and BLB2(n) are set to logic 1, transistors M1 and M2 turn on, thus the voltages VVDD1 and VVDD2 are kept at the normal level the same as the operation voltage VDD. While writing data through either pair of bit-lines BL1(n)-BLB1(n) and BL2(n)-BLB2(n), the power controller PC8(n) works similar to the power controller PC2(n) of FIG. 3.

Assuming logic 1 is to be written into cell Ue(m,n) through bit-lines BL1(n)-BLB1(n), bit-line BL1(n) holds logic 1 and bit-line BLB1(n) holds logic 0. Logic 0 of bit-line BLB1(n) turns off transistor M2, so the voltage VVDD2 is lowered; for cell Ue(m,n), conduction of transistor P2 is decreased, thus node QB can be readily discharged by pass-gate transistor T2. In addition, logic 1 of bit-line BL1(n) turns on transistor M1, and the voltage VVDD1 is kept at the normal level the same as the operation voltage VDD to facilitate pulling-up of node Q by transistor P1 to high voltage of logic 1.

RAM 108 works in a Read mode to read data stored in cell Ue(m,n). In this mode, bit-lines BL1(n), BLB1(n), BL2(n) and BLB2(n) are pre-charged to high voltage of logic 1, and either word-line WL1(m) or word-line WL2(m) rises to high to turn on the corresponding pass-gate transistors T1/T2 or T3/T4 of cell Ue(m,n); thus the voltage of either bit-line BL1(n) or bit-line BL2(n) can track that of node Q, and the voltages of corresponding bit-lines BLB1(n) or BLB2(n) follow that of node QB. Consequently, the voltages (states) of bit-lines BL1(n), BLB1(n), BL2(n) and BLB2(n) are marked as "x" in FIG. 16 during data read.

RAM 108 merely shows one embodiment applying two-port (multi-port) cells; other embodiments of the power controller PC8(n) can be derived from FIG. 1, FIG. 5 and FIG. 7. Moreover, a footer power controller, similar to that disclosed in FIG. 9, can be included in RAM 108 to provide the voltages VVSS1 and VVSS2 for transistors N1 and N2 of the cells.

To sum up, as revealed in aforementioned discussion, modern RAM faces conflict between requirements for data read and data write. With requirements of data Read fulfilled (by, e.g., adopting weakened pass-gate transistors in the cells), the efficiency and characteristics of data write degrade. To address both data read and write, a scheme with column-based independent supply controls for respective inverters forming latch structure in cells of each column according to data of bit-lines is disclosed; for each cell, it weakens tendency to resist data write (data flip), keeps/strengthens tendency to accept/drive data write (date flip), so efficiency of data write is enhanced, characteristic of data write, e.g., noise margin is improved, and speed, performance and characteristics of both data read and write are addressed.

In some kinds of prior arts, a word-line corresponding to a cell to be written is supplied with a boosted voltage, e.g., a voltage higher than that of the operation voltage VDD, during data write, so conduction of the pass-gate transistors of the cell can be enhanced. However, serious half-select disturb and stability issue also arise; that is, other cells coupled to the same word-line will suffer from potential incorrect data flip since conduction of their pass-gate transistors are also enhanced. Comparing with such kinds of prior arts, the invention does not supply boosted voltage to word-lines during Read access, thus the invention avoids potential half-select disturb. In another prior art, both inverters in each cell are supplied with lowered voltage during data write; though the prior art weakens tendency of resisting data write, it also weakens the feedback mechanism of the latch structure, and the overall improvement becomes less. Besides, as supplies for both inverters in each cell need to be switched/changed simultaneously, the prior art consumes more power, takes longer time for supplies switching, hence degrades accessing timing and speed. On the contrary, the invention applies individual supply control for each inverter of each cell, thus both tendencies of resisting and enhancing data write can be independently controlled. Moreover, as only one supply for one inverter in each cell needs to be switched, the invention reduces related power consumption to half, and results in faster supply switching and access time.

Some kinds of prior arts include additional transistors in each cell to implement supply controls for inverters of the latch structure. These prior arts suffer from lower circuitry density as layout area of each cell increases. In addition, since each cell of a same column includes additional transistors, the bit-line length and loading increase as well, and response speed of bit-lines is therefore decreased to degrade both data read and write. Comparing with such kinds of prior arts, the invention does not introduce structural changes in basic architecture of cells, and does not include additional transistors in each cell; as each power controller is shared by cells of the same column, the impacts of bit-line length/loading, access efficiency, layout area overhead and total gate count are minor and minimized. Besides, as supply controls of the invention follow timing of the bit-lines, no additional timing control is required, and good tolerances against variations of process, temperature and/or voltage are therefore established.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A Random Access Memory (RAM) comprising:
a plurality of cells arranged in a column and coupled to a bit-line, each cell having a first power node, a second power node, a bit node and comprising:
a first inverter with a supply source terminal, an input terminal and an output terminal respectively coupled to the first power node, a second data storage node and a first data storage node;
a second inverter with a supply source terminal, an input terminal and an output terminal respectively coupled to the second power node, the first data storage node and the second data storage node;
a pass-gate transistor with a terminal coupled to the bit node and an other terminal coupled to one of the first data storage node and the second data storage node; and
a power controller having a supply node coupled to the first power nodes of the plurality of cells and comprising:
a power-switch coupled to the bit-line and the supply node determining whether to connect the supply node to an operation voltage according to a voltage of the bit-line.

2. The RAM of claim 1 wherein the power controller further comprises:
a power-keeper coupled to the supply node; wherein when the power-switch does not connect the supply node to the operation voltage, the power-keeper provides a current to the supply node.

3. The RAM of claim 1 wherein the power-switch comprises:
   a power-switch transistor with a gate and two connection nodes respectively coupled to the bit-line, the operation voltage and the supply node.

4. The RAM of claim 3 wherein the power-switch further comprises:
   a logic circuit coupled between the gate and the bit-line performing logic operation of the voltage of the bit-line and a Write control signal, wherein the power-switch transistor determines whether to connect the supply node to the operation voltage according to a result of the logic operation performed by the logic circuit.

5. The RAM of claim 1 wherein in each of the plurality of cells the pass-gate transistor is coupled between the first data storage node and the bit node; each of the plurality of cells further has a second bit node and further comprises a second pass-gate transistor coupled between the second data storage node and the second bit node; the second bit nodes of the plurality of cells are coupled to a second bit-line; the power controller further has a second supply node coupled to the second power node of the plurality of cells, and further comprises:
   a second power-switch coupled to the second bit-line and the second supply node determining whether to connect the second supply node to the operation voltage according to a voltage of the second bit-line.

6. The RAM of claim 1 wherein each of the plurality of cells further has a third power node and a fourth power node; in each of the plurality of cells, the first inverter further has a second supply source terminal coupled to the third power node, the second inverter further has a second supply source terminal coupled to the fourth power node; and the RAM further comprises:
   a second power controller with a supply node coupled to the fourth power nodes of the plurality of cells, comprising:
   a second power-switch coupled to the bit-line and the supply node of the second power controller determining whether to connect the supply node of the second power controller to a second operation voltage according to the voltage of the bit-line;
   wherein the second operation voltage is different from the first operation voltage.

7. The RAM of claim 6 wherein the second power controller further comprises:
   a second power-keeper coupled to the supply node of the second power controller; wherein when the second power-switch does not connect the supply node of the second power controller to the second operation voltage, the second power-keeper provides a current to the supply node of the second power controller.

8. The RAM of claim 1 wherein in each of the plurality of cells the pass-gate transistor is coupled between the first data storage node and the bit node; each of the plurality of cells further has a second bit node, a third power node and a fourth power node and further comprises a second pass-gate transistor coupled between the second data storage node and the second bit node; in each of the plurality of cells, the first inverter further has a second supply source terminal coupled to the fourth power node; the second bit node of the plurality of cells are coupled to a second bit-line; and the RAM further comprises:
   a second power controller with a supply node coupled to the fourth power nodes of the plurality of cells, comprising:
   a second power- switch coupled to the second bit-line and the supply node of the second power controller determining whether to connect the supply node of the second power controller to a second operation voltage according to a voltage of the second bit-line; wherein the second operation voltage is different from the first operation voltage.

9. The RAM of claim 1 wherein in each of the plurality of cells the pass-gate transistor is coupled between the first data storage node and the bit node; each of the plurality of cells further has a second bit node and further comprises a second pass-gate transistor coupled between the first data storage node and the second bit node; the second bit node of the plurality of cells are coupled to a second bit-line, and the power-switch determines whether to connect the operation voltage to the supply node according to the voltage of the bit-line and a voltage of the second bit-line.

10. The RAM of claim 9 wherein the power-switch comprises:
   a power-switch transistor with a gate and two connection nodes, wherein the two connection nodes are respectively coupled to the operation voltage and the supply node; and
   a logic circuit coupled between the gate of the power-switch transistor, the bit-line and the second bit-line performing logic operation of the voltage of the bit-line and a voltage of the second bit-line,
   wherein the power-switch transistor determines whether to connect the supply node to the operation voltage according to a result of the logic operation.

* * * * *